United States Patent
Kwiatkowski

(10) Patent No.: US 9,761,957 B2
(45) Date of Patent: Sep. 12, 2017

(54) PROVIDING WIRELESS SERVICE AT A VENUE USING HORN ANTENNAS

(71) Applicant: Verizon Patent and Licensing Inc., Arlington, VA (US)

(72) Inventor: Doug Kwiatkowski, Washington, MI (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 611 days.

(21) Appl. No.: 14/465,121

(22) Filed: Aug. 21, 2014

(65) Prior Publication Data

US 2016/0056543 A1   Feb. 25, 2016

(51) Int. Cl.
| | | |
|---|---|---|
| H04W 40/00 | (2009.01) | |
| H01Q 21/28 | (2006.01) | |
| H01Q 13/02 | (2006.01) | |
| G06F 17/50 | (2006.01) | |
| H04B 7/022 | (2017.01) | |

(52) U.S. Cl.
CPC ............ *H01Q 21/28* (2013.01); *G06F 17/50* (2013.01); *H01Q 13/02* (2013.01); *H04B 7/022* (2013.01)

(58) Field of Classification Search
CPC ........ H01Q 13/02; H01Q 21/28; G06F 17/50; H04B 7/022
See application file for complete search history.

(56) References Cited

U.S. PATENT DOCUMENTS

| | | | |
|---|---|---|---|
| 2004/0176027 A1* | 9/2004 | O'Neill ............. | H04B 7/15535 455/7 |
| 2007/0123263 A1* | 5/2007 | Smith ................... | H01Q 1/125 455/445 |
| 2010/0080163 A1* | 4/2010 | Krishnamoorthi .... | H04L 12/189 370/312 |
| 2014/0062788 A1* | 3/2014 | Coleman ................ | H01Q 21/00 342/385 |

OTHER PUBLICATIONS

Wikipedia, "Distributed antenna system", http://en.wikipedia.org/wiki/Distributed_antenna_system, Apr. 14, 2014, 3 pages.
Wikipedia, "Horn antenna", http://en.wikipedia.org/wiki/Horn_antenna, Jun. 23, 2014, 9 pages.

* cited by examiner

*Primary Examiner* — Shahriar Behnamian

(57) ABSTRACT

A system may include horn antennas arranged at a venue. The horn antennas may be connected to an operator network that provides a wireless service. The horn antennas may provide the wireless service to at least one mobile device at the venue. The horn antennas may be arranged at the venue based on a configuration of the venue.

13 Claims, 9 Drawing Sheets

PROVIDING WIRELESS SERVICE AT A VENUE USING HORN ANTENNAS

BACKGROUND

A distributed antenna system (DAS) is a network of spatially separated antennas connected to a common source, such as a base station or eNodeB (eNB) that provides wireless service within a geographic area. For example, multiple low powered antennas may be positioned in the geographic area so as to provide coverage over a same area as single antenna operating at a high power.

DETAILED DESCRIPTION OF PREFERRED EMBODIMENTS

Figure 1:
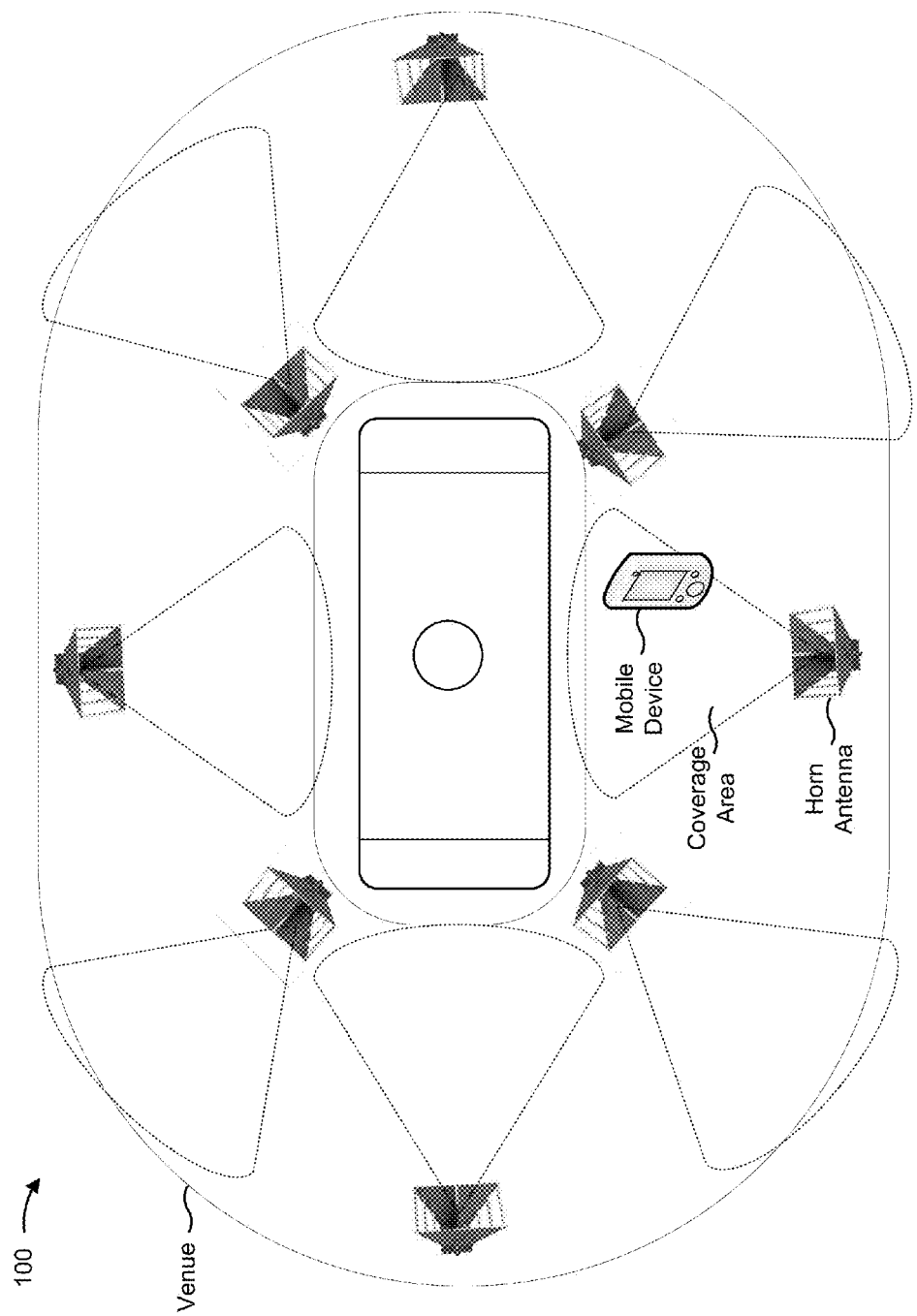
FIG. 1 is a diagram of an overview of an example implementation described herein.

The following detailed description of example implementations refers to the accompanying drawings. The same reference numbers in different drawings may identify the same or similar elements.

Large numbers of people may visit venues (e.g., stadiums, arenas, theaters, etc.) during events (e.g., football games, basketball games, concerts, etc.). Consequently, there may be a large number of mobile devices (e.g., phones, tablet computers, etc.) at the venue that use wireless service during an event. A venue may employ a DAS to provide the wireless service to the mobile devices. For example, the venue may have multiple antennas installed therein to provide wireless service to the mobile devices.

The venue may use panel antennas in the DAS. A panel antenna may include an antenna and a back plate reflector to direct radio frequency (RF) signals. Panel antennas are widely manufactured and used by service providers to provide wireless service to large geographic regions (e.g., a portion of a city, along a highway, etc.). For example, panel antennas may be placed on cell towers to provide wireless service for a surrounding area. Panel antennas are relatively inexpensive compared to other antennas, in part due to panel antennas being widely manufactured, and thus are commonly used in venues to provide wireless service.

A panel antenna is designed for optimal performance in a far field (e.g. far from the panel antenna), but has poor wireless service in a near field (e.g., near the panel antenna). For example, a panel antenna may perform best at a distance of a hundred meters away to a kilometer away. However, wireless service may suffer within a hundred meters of the panel antenna. Accordingly, while a panel antenna may be useful to provide wireless coverage to a large area (e.g., on a cell tower), a panel antenna may not provide optimal wireless service at a venue where mobile devices operate near the panel antennas (e.g., in a near field of the panel antennas).

Moreover, a panel antenna is designed to emit RF signals in multiple directions to cover a surrounding area, and not in targeted or specific directions. Thus, a panel antenna may be useful to provide wireless coverage to a wide area in multiple directions (e.g., on a cell tower). However, this attribute may not be attractive in a venue because interference may result when multiple panel antennas are used in a venue. For example, RF signals emitted from a first panel antenna located at one end of a venue may interfere with RF signals emitted from a second panel antenna located at another end of the venue because the directions of the RF signals cannot be properly controlled. Thus, it may be difficult to improve wireless service at a venue by simply adding more panel antennas to the venue because interference levels will increase as more panel antennas are added.

Accordingly, the same properties that may make panel antennas attractive for providing wireless service to mobile devices in large geographic areas (e.g., optimal performance in a far field and wide range directionality) may actually be problematic for providing wireless service in a venue using a DAS. Rather, antennas having properties previously thought to be undesirable for providing wireless service to mobile devices (e.g., optimal performance in a near field and limited or targeted directionality) may actually provide optimal wireless service in a venue using a DAS.

For example, a horn antenna has better near field performance and more targeted directionality than a panel antenna, and may provide better wireless service in a venue than a panel antenna. Moreover, a horn antenna has a flat voltage standing wave ratio (VSWR) across the entire bandwidth of the horn, unlike a panel antenna, which may result in improved wireless service. Furthermore, a horn antenna is a high broad-banded antenna that may provide wireless service on more frequency bands than a panel antenna, which may result in improved wireless service. Additionally, a horn antenna has linear gain from a low band (e.g., 700 megahertz (MHz)) to a high band (e.g., 2100 MHz), which may result in improved wireless service. In other words, a horn antenna may equalize coverage for lower wavelengths to the higher wavelengths by providing little or no gain at lower wavelengths (e.g., 700 MHz) and gain at higher wavelengths (e.g., 2100 MHz). Also, a horn antenna is smaller, more easily disguisable, and easier to mount than a panel antenna, which may make placement of a horn antenna in a venue easier than a panel antenna.

Implementations described herein may provide improved wireless service at a venue using horn antennas rather than panel antennas. In some implementations, a horn antenna's properties, location, and orientation may be configured based on the layout of a venue. In some implementations, a DAS including horn antennas may be provided at a venue resulting in less interference than a DAS that includes panel antennas, thereby increasing the quality of wireless service at the venue. However, in some implementations, a DAS including a combination of horn antennas and panel antennas may be used to provide wireless service at a venue due to the layout of the venue.

FIG. 1 is a diagram of an overview of an example implementation 100 described herein. As shown in FIG. 1, a system of horn antennas may be installed in a venue (e.g., a football stadium). The system of horn antennas may provide wireless service to mobile devices, such as long term evolution (LTE) service.

Each horn antenna may be positioned based on the configuration of the venue. For example, a horn antenna may be angled based on an angle of seating in the venue and/or oriented based on a seating arrangement of the venue. As shown in FIG. 1, the system of horn antennas may be arranged to minimize overlap of coverage areas so as to reduce interference.

Moreover, in some implementations, the horn antennas may be configured or manufactured to meet specifications based on the configuration of the venue. For example, a beamwidth of the horn antennas may be configured based on the venue and a number of horn antennas to be installed at the venue. For example, horn antennas with a narrow beamwidth may be used when horn antennas are to be placed near each other to reduce interference. Conversely, a wide beamwidth may be used when horn antennas are to be placed far apart from one another to ensure proper wireless coverage at the venue.

In this way, higher quality wireless coverage may be provided at a venue than if panel antennas are used.

Figure 2:
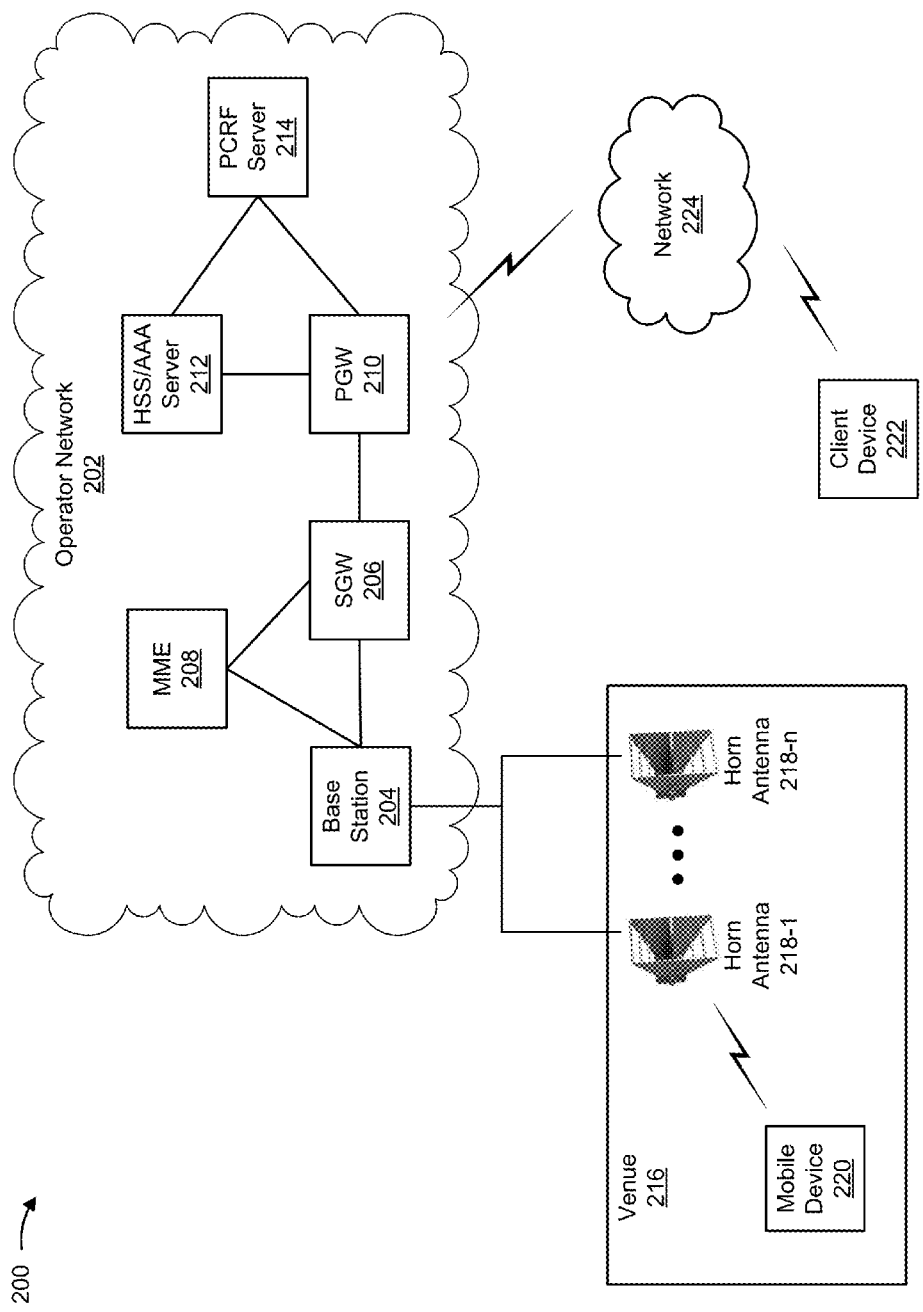
FIG. 2 is a diagram of an example environment in which systems and/or methods, described herein, may be implemented.

FIG. 2 is a diagram of an example environment 200 in which systems and/or methods described herein may be implemented. As shown in FIG. 2, environment 200 may include an operator network 202. Operator network 202 may include a base station 204, a serving gateway 206 (hereinafter referred to as "SGW 206"), a mobility management entity device 208 (hereinafter referred to as "MME 208"), a packet data network (PDN) gateway 210 (hereinafter referred to as "PGW 210"), a home subscriber server/authentication, authorization, accounting server 212 (hereinafter referred to as "HSS/AAA server 212"), and/or a policy and charging rules function server 214 (hereinafter referred to as "PCRF server 214"). Environment 200 may also include a venue 216, one or more horn antennas 218-1 through 218-n (n>1) (hereinafter referred to collectively as "horn antennas 218," and individually as "horn antenna 218"), a mobile device 220, a client device 222, and/or a network 224. Devices of environment 200 may interconnect via wired connections, wireless connections, or a combination of wired and wireless connections.

Operator network 202 may include an evolved packet system (EPS) that includes a LTE network and/or an evolved packet core (EPC) that operate based on a third generation partnership project (3GPP) wireless communication standard. The LTE network may be a radio access network (RAN) that includes one or more base stations 204, such as eNBs, via which mobile device 220 communicates with the EPC. The EPC may include SGW 206, MME 208, and/or PGW 210 that enables mobile device 220 to communicate with network 224, HSS/AAA server 212, and/or PCRF server 214 and may manage certain information and services, such as authentication, session initiation, account information, and/or a user profile, associated with mobile device 220. The LTE network may include multiple base stations 204, and the EPC may include multiple SGWs 206, MMEs 208, and/or PGWs 210. Additionally, or alternatively, operator network 202 may include a cellular network, a public land mobile network (PLMN), a second generation (2G) network, a third generation (3G) network, a fourth generation (4G) network, a fifth generation (5G) network, and/or another type of network.

Base station 204 may include one or more network devices that receive, process, and/or transmit traffic, such as audio, video, text, and/or other data, destined for and/or received from mobile device 220. In an example implementation, base station 204 may be an eNB device and may be part of the LTE network. Base station 204 may receive traffic from and/or send traffic to network 224 via SGW 206 and PGW 210. Base station 204 may send traffic to and/or receive traffic from mobile device 220 via an air interface using horn antennas 218. In some implementations, base station 204 may be connected to a DAS of horn antennas 218 located at venue 216. One or more of base stations 204 may be associated with a RAN, such as the LTE network.

SGW 206 may include one or more network devices, or other types of computation or communication devices, that gather, process, search, store, and/or provide information in a manner described herein. SGW 206 may include one or more data processing and/or traffic transfer devices, such as a gateway, a router, a modem, a switch, a firewall, a network interface card (NIC), a hub, a bridge, a proxy server, an optical add-drop multiplexer (OADM), or some other type of device that processes and/or transfers traffic. SGW 206 may, for example, aggregate traffic received from one or more base stations 204 and may send the aggregated traffic to network 224 via PGW 210. In some implementations, SGW 206 may route and forward data, may act as a mobility anchor for a user plane during inter-base station handovers, and may act as an anchor for mobility between LTE and other 3GPP technologies.

MME 208 may include one or more computation or communication devices that gather, process, search, store, and/or provide information in a manner described herein. For example, MME 208 may perform operations associated with a handoff to and/or from the EPS. MME 208 may perform operations to register mobile device 220 with the EPS, to handoff mobile device 220 from the EPS to another network, to handoff mobile device 220 from the other network to the EPS, and/or to perform other operations. MME 208 may perform policing operations for traffic destined for and/or received from mobile device 220.

PGW 210 may include one or more network devices that gather, process, search, store, and/or provide information in a manner described herein. PGW 210 may include one or more data processing and/or traffic transfer devices, such as a gateway, a router, a modem, a switch, a firewall, a NIC, a hub, a bridge, a proxy server, an OADM, or some other type of device that processes and/or transfers traffic. PGW 210 may, for example, provide connectivity of mobile device 220 to external packet data networks, such as network 224, by being a traffic exit/entry point for mobile device 220. PGW 210 may perform policy enforcement, packet filtering, charging support, lawful intercept, and packet screening. PGW 210 may also act as an anchor for mobility between 3GPP and non-3GPP technologies. PGW 210 may authenticate mobile device 220 (e.g., via interaction with HSS/AAA server 212).

HSS/AAA server 212 may include one or more server devices, or other types of computation or communication devices, that gather, process, search, store, and/or provide information in a manner described herein. For example, HSS/AAA server 212 may manage, update, and/or store, in a memory associated with HSS/AAA server 212, profile information associated with mobile device 220 that identifies applications and/or services that are permitted for and/or accessible by mobile device 220, bandwidth or data rate thresholds associated with the applications or services, information associated with a user of mobile device 220 (e.g., a username, a password, a personal identification number (PIN), etc.), a data plan, rate information, minutes allowed, and/or other information. Additionally, or alternatively, HSS/AAA server 212 may include a device that performs authentication, authorization, and/or accounting (AAA) operations associated with a communication session with mobile device 220. With regard to the authentication operation, HSS/AAA server 212 may verify a device's (e.g., mobile device 220) specific digital identity provided via an identifier (e.g., a password, a digital certificate, a phone number, etc.) associated with the device. With regard to the authorization function, HSS/AAA server 212 may grant or refuse privileges to a device (e.g., mobile device 220) for accessing specific services (e.g., IP address filtering, address assignment, route assignment, QoS, etc.). With regard to the accounting operation, HSS/AAA server 212 may track consumption of network resources (e.g., by mobile device 220) and may use this information for management, planning, billing, etc.

PCRF server 214 may perform operations that enforce EPS policies associated with a communication session with mobile device 220. For example, PCRF server 214 may dynamically provide real-time bandwidth allocations and/or controls (e.g., associated with a particular access point name (APN)) associated with particular applications, network accesses, and/or services provided to mobile device 220 during a communication session. PCRF server 214 may also dynamically provide a real-time signal flow policy to adapt to changing conditions within the network and/or to manage traffic flow during the communication session.

Venue 216 may be a location and/or structure where people gather. In some implementations, venue 216 may be a location where particular events take place (e.g., sporting events, concerts, plays, etc.). Venue 216 may be indoors, outdoors, or a combination of indoors and outdoors. For example, venue 216 may include a stadium (with or without a closed roof), an arena, a concert hall, a convention center, an amphitheater, an auditorium, a park, etc. In some implementations, venue 216 may include seating and/or an event area (e.g., a field, a court, a rink, a stage, etc.).

Horn antenna 218 may include an antenna that converts electric power into radio waves, or vice versa. In some implementations, horn antenna 218 may include a waveguide shaped like a horn to direct radio waves in a particular direction. In some implementations, horn antenna 218 may be connected to base station 204 by a cable (e.g., a coaxial cable). In some implementations, horn antenna 218 may be connected to base station 204 via a wireless connection.

Mobile device 220 may include a device capable of receiving, processing, and providing information. For example, mobile device 220 may include a mobile phone (e.g., a smart phone, a radiotelephone, etc.), a computing device (e.g., a laptop computer, a tablet computer, a handheld computer, a gaming device, etc.), or a similar device. In some implementations, mobile device 220 may include a communication interface that allows mobile device 220 to receive information from and/or transmit information to another device in environment 200. In some implementations, mobile device 220 may connect to operator network 202 via horn antenna 218.

Client device 222 may include a device capable of receiving, processing, and providing information. For example, client device 222 may include a mobile phone (e.g., a smart phone, a radiotelephone, etc.), a computing device (e.g., a desktop computer, a laptop computer, a tablet computer, a handheld computer, a gaming device, etc.), or a similar device. In some implementations, client device 222 may include a communication interface that allows client device 222 to receive information from and/or transmit information to another device in environment 200. In some implementations, client device 222 may execute a DAS program for determining a placement of horn antennas 218 in venue 216.

Network 224 may include one or more wired and/or wireless networks. For example, network 224 may include a cellular network (e.g., an LTE network, a 3G network, a code division multiple access (CDMA) network, etc.), a public land mobile network (PLMN), a wireless local area network (e.g., a Wi-Fi network), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, and/or a combination of these or another type of network.

The number and arrangement of devices and networks shown in FIG. 2 is provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
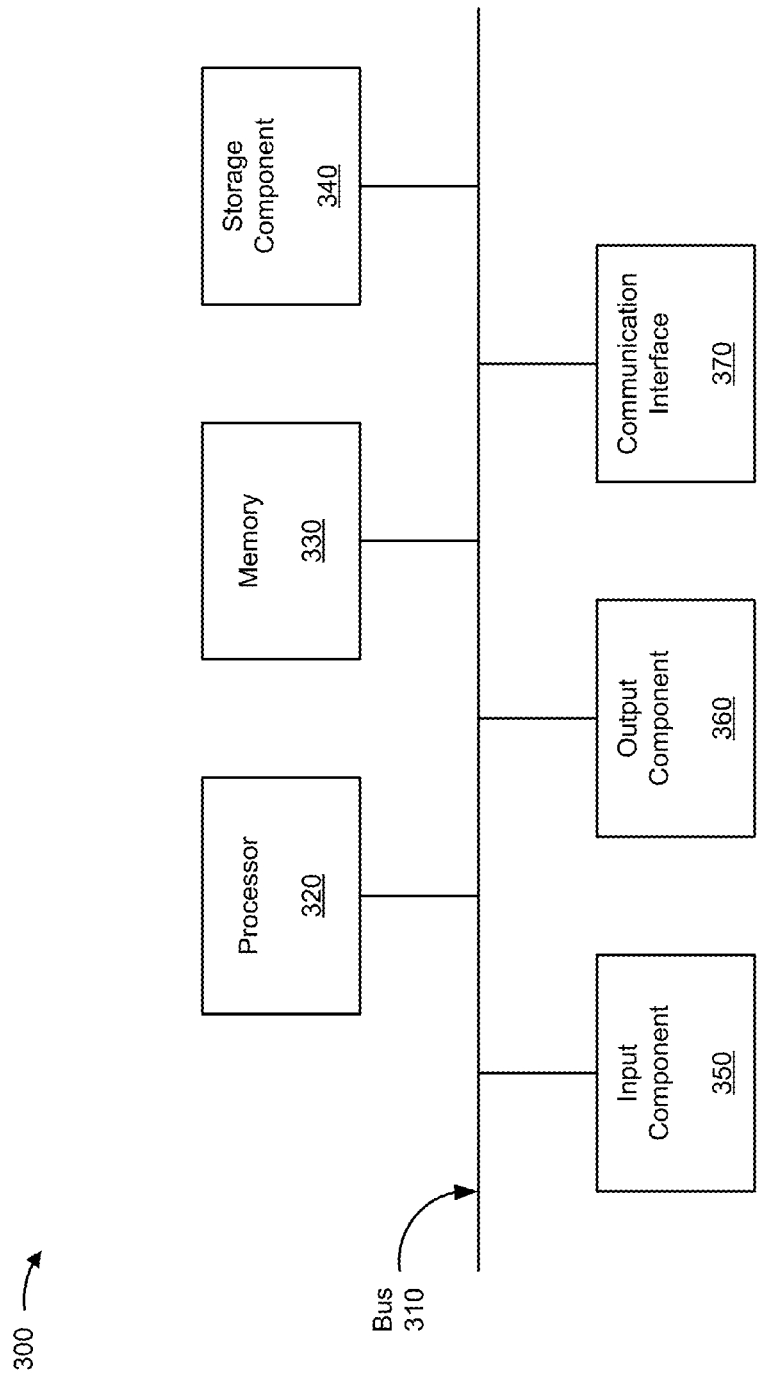
FIG. 3 is a diagram of example components of one or more devices of FIG. 2.

FIG. 3 is a diagram of example components of a device 300. Device 300 may correspond to base station 204, SGW 206, MME 208, PGW 210, HSS/AAA server 212, PCRF server 214, mobile device 220, and/or client device 222. In some implementations, base station 204, SGW 206, MME 208, PGW 210, HSS/AAA server 212, PCRF server 214, mobile device 220, and/or client device 222 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that interprets and/or executes instructions. Memory 330 may include a random access memory (RAM), a read only memory (ROM), and/or another type of dynamic or static storage device (e.g., a flash memory, a magnetic memory, an optical memory, etc.) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

Input component 350 may include a component that permits device 300 to receive information, such as via user input (e.g., a touch screen display, a keyboard, a keypad, a mouse, a button, a switch, a microphone, etc.). Additionally, or alternatively, input component 350 may include a sensor for sensing information (e.g., a global positioning system (GPS) component, an accelerometer, a gyroscope, an actuator, etc.). Output component 360 may include a component that provides output information from device 300 (e.g., a display, a speaker, one or more light-emitting diodes (LEDs), etc.).

Communication interface 370 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 is provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
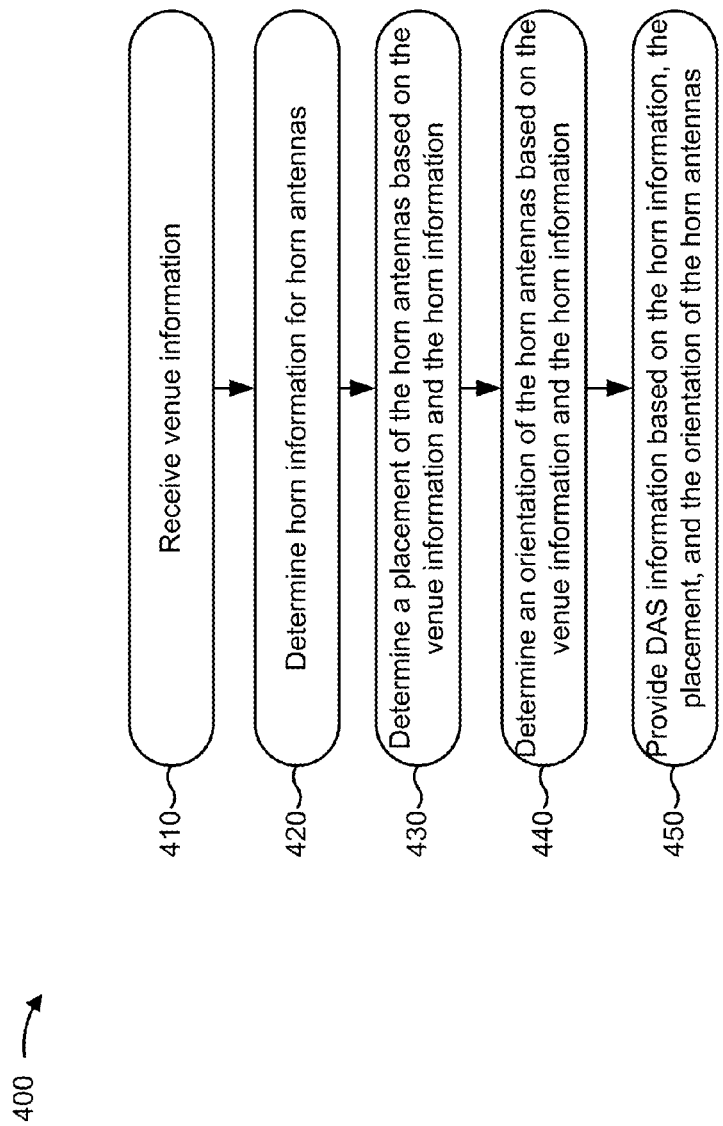
FIG. 4 is a flow chart of an example process for determining a placement and an orientation of horn antennas at a venue.

FIG. 4 is a flow chart of an example process 400 for determining a placement and orientation of horn antennas 218 at venue 216. In some implementations, one or more process blocks of FIG. 4 may be performed by client device 222. Additionally, or alternatively, one or more process blocks of FIG. 4 may be performed by another device or a group of devices separate from or including client device 222, such as base station 204, SGW 206, MME 208, PGW 210, HSS/AAA server 212, PCRF server 214, and/or mobile device 220.

As shown in FIG. 4, process 400 may include receiving venue information (block 410). For example, client device 222 may receive the venue information from another device or from user input.

In some implementations, another device, such as a server device, may send the venue information to client device 222 (e.g., via network 224 or a physical connection). Client device 222 may receive the venue information and store the venue information in a memory included in or accessible by client device 222.

The venue information may include a blueprint of venue 216, architectural information for venue 216, engineering information for venue 216, design information for venue 216, computer-aided design (CAD) information for venue 216, or the like. In some implementations, the venue information may indicate a size of venue 216, a shape of venue 216, a location of obstructions in venue 216 (e.g., polls, overhangs, beams, walls, etc.), a location of a field (e.g., a football field, a soccer field, etc.), a location of a stage, a location of a court (e.g., a basketball court), a location of a rink (e.g., an ice rink), a location of hallways, a location of walkways, a location of tunnels, etc.

In some implementations, the venue information may include seating information. The seating information may indicate a seating capacity of venue 216, a seating arrangement of venue 216, an angle of seating in venue 216, whether the seating is covered by an overhang or a roof, etc.

As further shown in FIG. 4, process 400 may include determining horn information for horn antennas 218 (block 420). For example, client device 222 may determine the horn information.

The horn information may indicate a configuration of horn antenna 218 and/or properties of horn antenna 218. For example, the horn information may indicate a frequency range, an antenna factor, a gain, a maximum continuous power, a maximum radiated field, a pattern type, an electric field (E-field) beamwidth, a magnetizing field (H-field) beamwidth, an impedance, a voltage standing wave ratio (VSWR), a connector type, and/or a mounting base type.

In some implementations, the horn information may be pre-set and client device 222 may receive the horn information from another device and/or via user input. For example, non-custom made horn antennas 218 with pre-set and known horn information may be considered for use in venue 216.

Additionally, or alternatively, custom made horn antennas 218 may be used in venue 216. In other words, horn antennas 218 may be manufactured based on the characteristics of venue 216. In such a case, client device 222 may determine the horn information based on the venue information. In other words, client device 222 may determine an optimal configuration and/or properties of horn antenna 218 based on the configuration of venue 216. For example, E-field and H-field beamwidths may be determined based on a size of venue 216, a shape of venue 216, a seating arrangement of venue 216, an angle of seating in venue 216, a seating capacity of venue 216, and/or whether the seating is covered by an overhang or a roof. Horn antennas 218 may be manufactured to produce the determined E-field and H-field beamwidths.

In some implementations, the horn information may indicate the same configuration and/or properties for all horn antennas 218. In other words, all horn antennas 218 may be the same.

On the other hand, the horn information may indicate different configurations and/or properties for different horn antennas 218. In other words, all horn antennas 218 may not be the same. For example, a different horn antenna 218 may be used in a corner of venue 216 than a horn antenna 218 used along a straight portion of venue 216. For instance, a first horn antenna 218 used near a corner of an end zone of a football stadium may be configured to have E-field and H-field beamwidths different than a second horn antenna 218 used near a 50 yard line of the football stadium.

As further shown in FIG. 4, process 400 may include determining a placement of horn antennas 218 based on the venue information and the horn information (block 430). For example, client device 222 may determine the placement of horn antennas 218 in venue 216.

In some implementations, client device 222 may identify locations within venue 216 to place and/or install horn antennas 218 based on the venue information and the horn information. For example, client device 222 may identify locations to install horn antennas 218 based on the blueprints of venue 216, locations of obstructions within venue 216, a seating arrangement of venue 216, a seating capacity of venue 216, and/or the E-field and H-field beamwidths of horn antennas 218.

In some implementations, client device 222 may determine a distance between horn antennas 218 based on the venue information and the horn information. For example, client device 222 may determine a distance between horn antennas 218 based on the size and shape of venue 216, a seating capacity of venue 216, and/or the E-field and H-field beamwidths of horn antennas 218.

Additionally, or alternatively, client device 222 may determine a number of horn antennas 218 to place within venue 216 based on the venue information and the horn information. For example, client device 222 may determine a number of horn antennas 218 to place within venue 216 based on a seating capacity of venue 216, a seating arrangement of venue 216, an amount or area of seating of venue 216, and/or the E-field and H-field beamwidths of horn antennas 218.

As further shown in FIG. 4, process 400 may include determining an orientation of horn antennas 218 based on the venue information and the horn information (block 440). For example, client device 222 may determine the orientation of horn antennas 218 in venue 216.

In some implementations, client device 222 may determine a direction for horn antenna 218 to face based on a location of horn antenna 218 in venue 216 and the venue information. For example, if venue 216 is a football stadium, a horn antenna 218 placed at the field level may be oriented to face away from the field and toward the stands (e.g., seating). Additionally, or alternatively, a horn antenna 218 placed near the back of the stands may be oriented to face toward the field.

In some implementations, client device 222 may determine an angle for antenna 218 to face based on a location of horn antenna 218 in venue 216 and the venue information. For example, client device 222 may determine an angle for horn antenna 218 based on the angle of the seating. For instance, assume the seating included in venue 216 is angled at 30°. Accordingly, client device 222 may determine horn antenna 218 should be placed above the seating (e.g., 1 meter (m) above the seating, 5 m above the seating, 10 m, above the seating, etc.) and angled at 30° so that the angle of the seating matches the angle of horn antenna 218.

In some implementations, the angle of the horn antenna 218 may be determined to be different than the angle of the seating. For example, if venue 216 is a football stadium, a horn antenna 218 at the field level facing away from the field may have an angle greater than or equal to the angle of the seating such that the RF signals emitted by horn antenna 218 will be emitted toward the seating and beyond the seating (e.g., outside the stadium). On the other hand, a horn antenna 218 that is facing the field may have an angle less than or equal to the angle of the seating such that the RF signals emitted by horn antenna 218 will be emitted into the stands and/or field without (or with limited) RF signals being directed at seating on an opposite side of the field. Accordingly, interference caused by horn antenna 218 at other sections of venue 216 may be reduced.

In this way, a position and orientation of horn antennas 218 in a DAS may be determined such that RF signals from horn antennas 218 may cover particular portions of venue 216 and that interference with RF signals emitted by other horn antennas 218 is limited.

Although identifying the number of horn antennas 218, the location of horn antennas 218, and the orientation of horn antennas 218, have been described as separate operations, these operations may be performed concurrently. In some implementations, client device 222 may generate scores for different layouts of horn antennas 218 as a function of the number of horn antennas 218, the location of horn antennas 218, and the orientation of horn antennas 218 in a layout. A score may indicate a quality of coverage at venue 216 for the respective layout of horn antennas 218 at venue 216.

As further shown in FIG. 4, process 400 may include providing DAS information based on the horn information, the placement, and the orientation of the horn antennas 218 (block 450). For example, client device 222 may provide the DAS information by sending the DAS information to another device and/or by displaying the DAS information to a user of client device 222.

The DAS information may indicate the horn information, the placement of horn antennas 218, and the orientations of horn antennas 218 in venue 216. In some implementations, the DAS information may include CAD information (e.g., a CAD drawing) indicating the positions and orientations of horn antennas 218 in venue 216 and/or detailed instructions for installing horn antennas 218.

In some implementations, the DAS information may indicate the scores for one or more layouts of horn antennas 218 and a user may select a layout based on the score. For example, a user may select a layout with the highest score to obtain the best wireless coverage at venue 216. However, the user may select a layout with a lower score based on other factors, such as the cost or difficulty of installing horn antennas 218 according to the layout.

Accordingly, client device 222 may automatically identify placements and orientations of horn antennas 218 at venue 216 to provide optimal wireless coverage for mobile devices 220 located in or near venue 216.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Furthermore, although process 400 has been described with respect to providing DAS information for a DAS including horn antennas 218 and not panel antennas, in some implementations, the DAS information may indicate a placement and orientation for a combination of horn antennas 218 and panel antennas. For example, if a layout of a venue, a placement of a panel antenna, an orientation of the panel antenna, and a configuration of the panel antenna allow for the coverage area of the panel antenna to be targeted to a particular part of venue 216 so as to reduce interference and overlap with coverage areas of other antennas, then a combination of horn antennas 218 and panel antennas may be used in the DAS. Alternatively, a DAS that includes horn antennas 218 and that does not include panel antennas may be used.

Figure 5A:
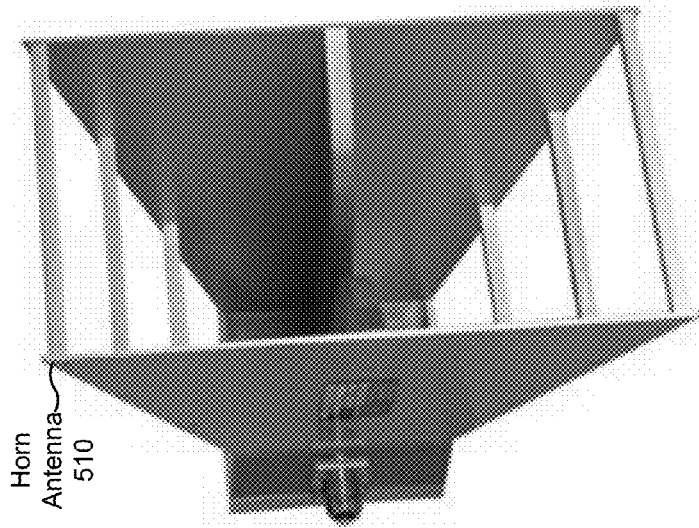
FIGS. 5A-5C are diagrams of an example implementation relating to an example process shown in FIG. 4.
Figure 5B:
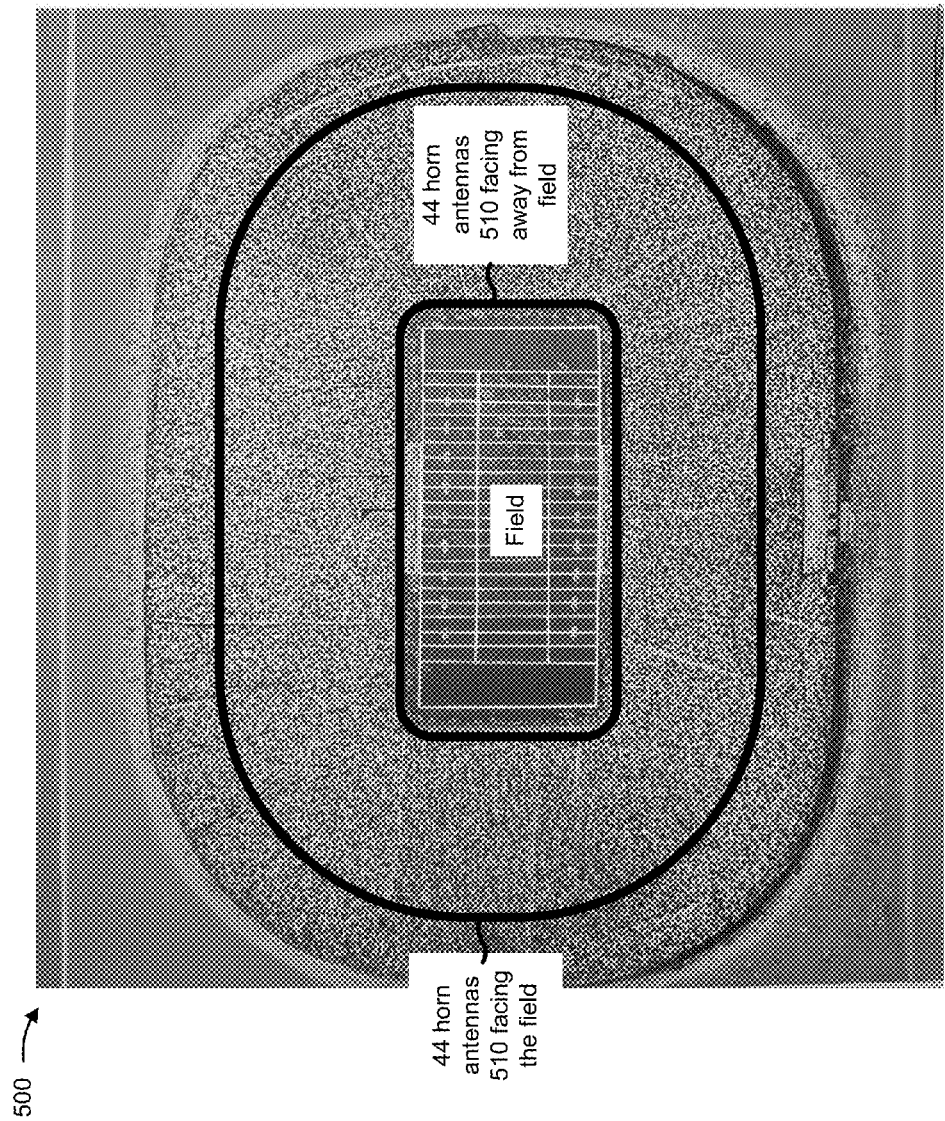
Figure 5C:
Figure 5C:
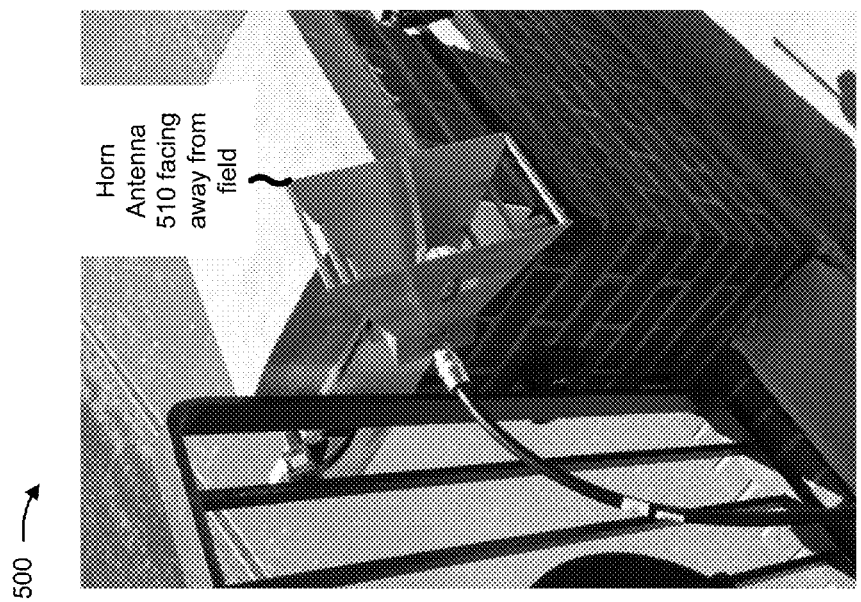

FIGS. 5A-5C are diagrams of an example implementation 500 relating to example process 400 shown in FIG. 4. FIGS. 5A-5C show an example of determining a placement and orientation of horn antennas 218 at venue 216.

FIG. 5A illustrates an example of a horn antenna 510 (e.g., horn antenna 218) used in example implementation 500. As shown in FIG. 5A, horn antenna 510 may have multiple properties, which are indicated by horn information. For example, horn antenna 510 may have a frequency range of 700 MHz to 18 GHz. Horn antenna 510 may have an antenna factor of 22 decibels (dB) to 44 dB. Horn antenna 510 may have a gain of 1.4 decibels-isotropic (dBi) to 15 dBi. Horn antenna 510 may have a maximum continuous power of 300 watts. Horn antenna 510 may have a maximum radiated field of 200 volts per meter (V/m). Horn antenna 510 may have a directional pattern type. Horn antenna 510 may have an E-field beamwidth of 48° and an H-field beamwidth of 30°. Horn antenna 510 may have an impedance of 50 ohms (Ω). Horn antenna 510 may have voltage standing wave ratio (VSWR) of 1.6:1 (3.5:1 max). Horn antenna 510 may have an N-Type female connector and a ¼-20 thread, female mounting base. This is just one example of horn information. Assume client device 222 obtains the horn information indicating the properties of horn antenna 510.

FIG. 5B illustrates an example of a stadium (e.g., venue 216) used in example implementation 500. As shown in FIG. 5B, the stadium may have a field in the center and have seating surrounding the field. Assume the seating is inclined at a 45° angle from the field. Further, assume the stadium has a seating capacity of 110,000 people.

Assume client device 222 obtains venue information indicating the configuration of the stadium. Further, assume client device 222 determines a quantity of horn antennas 510 to place at the stadium, locations to place horn antennas 510, and orientations of horn antennas 510 based on the horn information and the venue information.

For example, as shown in FIG. 5B, client device 222 may determine to place 88 horn antennas 510 in the stadium. Client device 222 may determine that 44 horn antennas 510 should be placed at a field level so as to surround the field and face away from the field. The 44 horn antennas 510 may be angled up at a 45° angle, and provide a narrow wireless service coverage area at the field level and a wide wireless service coverage area near the outside edge of the stadium. Client device 222 may determine that another 44 horn antennas 510 should be placed in the seating area near an edge of the stadium so as to surround the field and face toward the field. The other 44 horn antennas 510 may be angled down at a 45° angle, and provide a wide wireless service coverage area at the field level and a narrow wireless service coverage area near the outside edge of the stadium. Accordingly, in combination, the 44 horn antennas 510 located at the field level and the 44 horn antennas 510 located near the outside edge of the venue may provide wireless service to all parts of the stadium by targeting different parts of the stadium.

Client device 222 may output DAS information indicating the placement and orientation of each horn antenna 510, and horn antennas 510 may be installed at the stadium based on the DAS information.

FIG. 5C illustrates an example of two horn antennas 510 installed at the stadium. For example, a horn antenna 510 placed at a field level may be attached to a post or pillar at the field level and angled up toward the seating or stands. A horn antenna 510 placed in the seating near the edge of the stadium may be installed above a tunnel used to enter the seating part of the stadium and angled down toward the field.

As indicated above, FIGS. 5A-5C are provided merely as an example. Other examples are possible and may differ from what was described with regard to FIGS. 5A-5C.

Figure 6A:
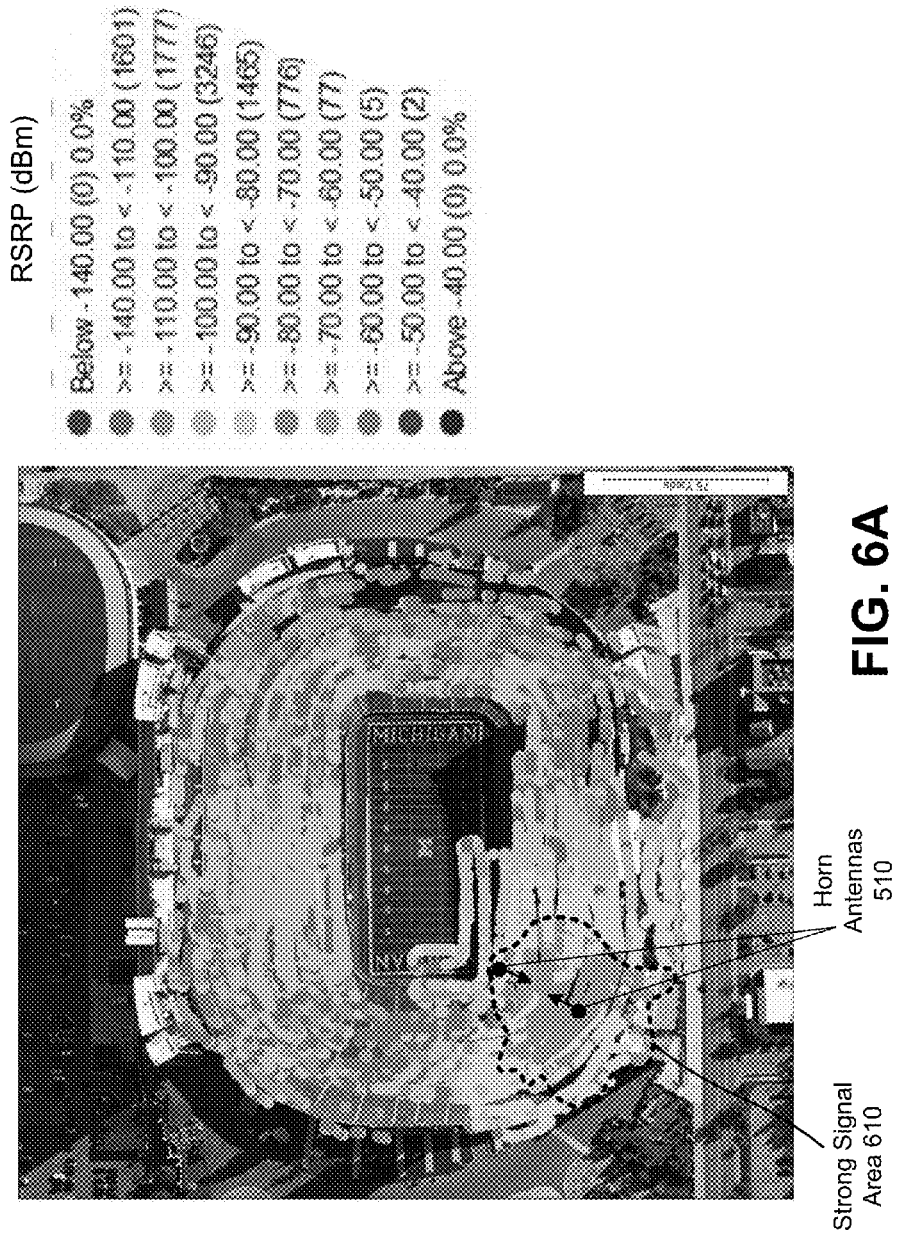
FIGS. 6A and 6B are diagrams of an example test comparing signal measurements taken with two horn antennas installed at a venue with a panel antenna installed at venue.
Figure 6B:
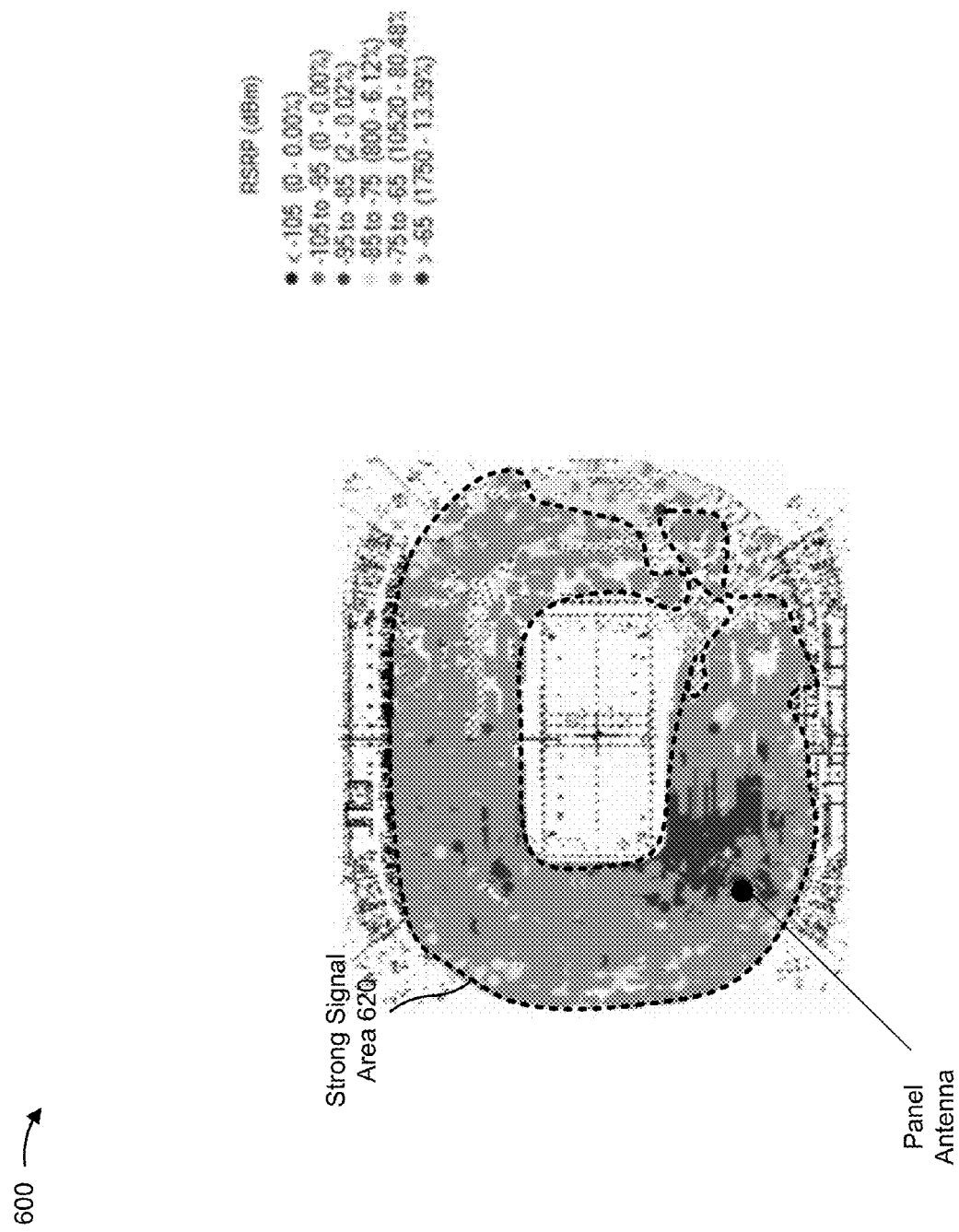

FIGS. 6A and 6B are diagrams of an example test 600 comparing signal measurements taken with two horn antennas 510 installed at venue 216 with a panel antenna installed at venue 216.

As shown in FIG. 6A, assume that two horn antennas 510 are installed in section 28 at Michigan Stadium in Ann Arbor, Mich. (e.g., venue 216). Assume that a first horn antenna 510 is placed near the field edge in section 28 so as to face away from the field (as indicated in FIG. 6A by the arrow pointing away from the field). Further, assume a second horn antenna 510 is placed near a tunnel of section 28 so as to face toward the field (as indicates in FIG. 6A by the arrow pointing toward the field).

Assume that RF signals are emitted from the two horn antennas 510 and a Reference Signal Received Power (RSRP) is measured throughout the stadium. The area enclosed by the dashed line roughly indicates a strong signal area 610 where the RSRP is measured to be −80.00 decibel-milliwatts (dBm) or greater. A minimum RSRP of −80.00 dBm to −75.00 dBm at a venue 216 like Michigan Stadium may be used to provide adequate wireless service to a mobile device 220. Strong signal area 610 (e.g., an area with RSRP greater than or equal to −80.00 dBm) covers 9.7% of the seating area of Michigan Stadium. As shown in FIG. 6A, strong signal area 610 is primarily isolated to a corner of Michigan Stadium where the two horn antennas 510 are placed.

As shown in FIG. 6B, assume that a panel antenna is installed in section 28 at Michigan Stadium (e.g., venue 216) replacing the two horn antennas 218. Assume that the panel antenna is placed near the tunnel of section 28.

Further, assume RF signals are emitted from the panel antenna and a RSRP is measured throughout the stadium. The area enclosed by the dashed line roughly indicates a strong signal area 620 where the RSRP is measured to be −75.00 dBm or greater. Strong signal area 620 (e.g., an area with RSRP greater than or equal to −75.00 dBm) covers 93.87% of the seating area of Michigan Stadium. As shown in FIG. 6B, strong signal area 620 extends all around the field and is not isolated to the corner where the panel antenna is placed.

As can be seen in FIGS. 6A and 6B, strong coverage area 610 created by horn antennas 510 covers a more targeted area than strong coverage area 620 created by a panel antenna. Accordingly, more horn antennas 510 may be placed around Michigan Stadium in a DAS with limited overlap of the strong coverage areas 610 created by horn antennas 510, thus resulting in low levels of interference and high quality signals in Michigan Stadium. On the other hand, if more panel antennas are placed around Michigan Stadium in a DAS, there will be high levels of overlap of strong coverage areas 620 created by the panel antennas, thus resulting in high levels of interference and low quality signals in Michigan Stadium.

Accordingly, horn antennas 510 may provide better wireless service in Michigan Stadium than if panel antennas are used.

FIGS. 6A and 6B are provided merely as an example and a counter example. Other examples are possible and may differ from what was described with regards to FIGS. 6A and 6B.

Implementations described herein may provide improved wireless service at a venue using horn antennas rather than panel antennas. In some implementations, a quantity of horn antennas, a horn antenna's properties, location, and orientation may be configured based on the layout of a venue. In some implementations, a DAS including horn antennas may be provided at a venue resulting in less interference than a DAS including panel antennas, thereby increasing the quality of wireless service at the venue.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A non-transitory computer-readable medium storing instructions, the instructions comprising: one or more instructions that, when executed by one or more processors, cause the one or more processors to: receive venue information for a venue, the venue information indicating a configuration of the venue; determine horn information for a plurality of horn antennas, the horn information indicating at least one property of the plurality of horn antennas; determine a placement of the plurality of horn antennas at the venue based on the venue information and the horn information, the plurality of horn antennas being configured to provide a wireless service at the venue, the placement of the plurality of horn antennas causing each of the plurality of horn antennas to provide the wireless service to targeted parts of the venue; and provide antenna system information indicating the determined placement of the plurality of horn antennas at the venue.

2. The non-transitory computer-readable medium of claim 1, where the venue information indicates a seating arrangement and a seating capacity of the venue, and where the one or more instructions, that determine the placement of the plurality of horn antennas, further cause the one or more processors to: determine the placement of the plurality of horn antennas based on the seating arrangement and the seating capacity of the venue.

3. The non-transitory computer-readable medium of claim 1, where the venue information indicates a seating angle of seating at the venue, and where the one or more instructions, that determine the placement of the plurality of horn antennas, further cause the one or more processors to: determine an angle of the plurality of horn antennas based on the seating angle of the seating at the venue.

4. The non-transitory computer-readable medium of claim 1, where the one or more instructions, that cause the one or more processors to determine the horn information, further cause the one or more processors to: determine the at least one property of the plurality of horn antennas based on the configuration of the venue.

5. The non-transitory computer-readable medium of claim 1, where the venue information indicates at least one of a size of the venue, a shape of the venue, a location of an obstruction at the venue, a seating arrangement of the venue, an angle of seating in the venue, or a seating capacity of the venue, and where the one or more instructions, that cause the processors to determine the horn information, further cause the one or more processors to:
determine a beamwidth for the plurality of horn antennas based on at least one of the size of the venue, the shape of the venue, the location of the obstruction at the venue, the seating arrangement of the venue, the angle of seating in the venue, or the seating capacity of the venue, the at least one property of the antenna including the beamwidth.

6. The non-transitory computer-readable medium of claim 1, where the plurality of horn antennas include a first horn antenna and a second horn antenna, and the venue includes an event area, and where the one or more instructions, that cause the one or more processors to determine the placement of the plurality of horn antennas, further cause the one or more processors to: determine the first horn antenna be placed to face toward the event area; and determine the second horn antenna be placed to face away from the event area.

7. The non-transitory computer-readable medium of claim 6, where the one or more instructions, that cause the one or more processors to determine the placement of the plurality of horn antennas, further cause the one or more processors to:
determine the first horn antenna be declined with respect to the event area, and determine the second horn antenna be inclined with respect to the event area.

8. A method, comprising:
receiving, by a device, venue information for a venue, the venue information indicating a configuration of the venue;
receiving, by the device, horn information for a plurality of horn antennas,
the horn information indicating at least one property of the plurality of horn antennas;
determining, by the device, a respective placement and a respective orientation of the plurality of horn antennas at the venue based on the venue information and the horn information,
the plurality of horn antennas being configured to provide a wireless service at the venue,
the placement and the orientation of the plurality of horn antennas causing each of the plurality of horn antennas to provide the wireless service to targeted parts of the venue; and
providing, by the device, information indicating the placement and the orientation of the plurality of horn antennas at the venue.

9. The method of claim 8, where the venue information indicates a seating arrangement and a seating capacity of the venue, and where determining the respective placement and the respective orientation of the plurality of horn antennas further comprises:
  determining the respective placement and the respective orientation of the plurality of horn antennas based on the seating arrangement and the seating capacity of the venue.

10. The method of claim 8, where the venue information indicates a seating angle of seating at the venue, and
where determining the respective placement and the respective orientation of the plurality of horn antennas further comprises:
  determining an angle of the plurality of horn antennas based on the seating angle of the seating at the venue.

11. The method of claim 8, where determining the respective placement and the respective orientation of the plurality of horn antennas further comprises:
  determining a distance between the plurality of horn antennas based on the venue information and the horn information.

12. The method of claim 8, further comprising:
determining a quantity of the plurality of horn antennas to place at the venue based on the venue information and the horn information.

13. The method of claim 8, where the plurality of horn antennas include a first horn antenna and a second horn antenna, and the venue includes an event area, and
where determining the placement and the orientation of the plurality of horn antennas further comprises:
  determining the first horn antenna be arranged to face toward the event area, and
  determining the second horn antenna be arranged to face away from the event area.

\* \* \* \* \*